(12) United States Patent
Stavrev et al.

(10) Patent No.: US 12,453,291 B2
(45) Date of Patent: Oct. 21, 2025

(54) SEMICONDUCTOR DIE WITH SENSOR SECTION LOCATED AT THE EDGE

(71) Applicant: Infineon Technologies AG, Neubiberg (DE)

(72) Inventors: Momtchil Stavrev, Dresden (DE); Dirk Meinhold, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 881 days.

(21) Appl. No.: 17/445,858

(22) Filed: Aug. 25, 2021

(65) Prior Publication Data

US 2022/0069203 A1 Mar. 3, 2022

(30) Foreign Application Priority Data

Sep. 1, 2020 (DE) .................. 102020122871.6

(51) Int. Cl.
*H10N 52/00* (2023.01)
*B81B 3/00* (2006.01)
*H10N 52/80* (2023.01)

(52) U.S. Cl.
CPC ......... *H10N 52/101* (2023.02); *B81B 3/0032* (2013.01); *H10N 52/80* (2023.02); *B81B 2201/0264* (2013.01); *B81B 2201/0292* (2013.01)

(58) Field of Classification Search
CPC .... H10N 52/101; H10N 52/80; B81B 3/0032; B81B 2201/0264; B81B 2201/0292; B81B 2207/015; B81B 2207/03; B81B 2207/097; B81B 2207/092; B81B 2207/07; H01L 2224/32225; H01L 2224/04042; H01L 24/83; H01L 24/05; H01L 24/48; H01L 24/85; H01L 24/73; H01L 2224/48227; H01L 2224/48464; H01L 2224/73265; H01L 21/565; H01L 23/3121; H01L 2224/8385; H01L 2224/8592; H01L 2924/00014; H01L 23/3107; H01L 24/29; H10D 89/10; G01L 19/0092
See application file for complete search history.

(56) References Cited

U.S. PATENT DOCUMENTS

| 5,852,320 A | * | 12/1998 | Ichihashi | G01L 19/0084 257/419 |
| 9,070,695 B2 | | 6/2015 | Daamen et al. | |
| 11,092,505 B2 | | 8/2021 | Van Dommelen et al. | |
| 2005/0115321 A1 | * | 6/2005 | Benzel | G01P 15/08 73/25.05 |
| 2008/0128840 A1 | * | 6/2008 | Benzel | G01L 19/141 438/51 |

(Continued)

FOREIGN PATENT DOCUMENTS

| CN | 101044088 A | 9/2007 |
| CN | 102331325 A | 1/2012 |

(Continued)

*Primary Examiner* — Latanya N Crawford Eason
(74) *Attorney, Agent, or Firm* — Harrity & Harrity, LLP (57) ABSTRACT

A semiconductor die is proposed, wherein the semiconductor die comprises a microelectronic section and a sensor section. The microelectronic section comprises an integrated circuit. The sensor section adjoins an edge of the semiconductor die. A sensor is also proposed, which comprises such a semiconductor die.

20 Claims, 10 Drawing Sheets

(56) References Cited

U.S. PATENT DOCUMENTS

| | | | | |
|---|---|---|---|---|
| 2010/0133631 A1* | 6/2010 | Benzel | ............. | G01L 19/141 |
| | | | | 264/279 |
| 2011/0036174 A1* | 2/2011 | Hooper | ............. | G01L 19/0084 |
| | | | | 438/51 |
| 2012/0012949 A1* | 1/2012 | Winkler | ............. | G01L 19/148 |
| | | | | 264/272.17 |
| 2015/0060956 A1* | 3/2015 | Chen | ............. | B81C 1/00246 |
| | | | | 257/254 |
| 2016/0148880 A1* | 5/2016 | Coffy | ............. | H01L 21/561 |
| | | | | 257/773 |
| 2019/0375628 A1* | 12/2019 | Besling | ............. | G01D 11/245 |

FOREIGN PATENT DOCUMENTS

| | | | |
|---|---|---|---|
| CN | 103021970 A | 4/2013 | |
| CN | 110473840 A | 11/2019 | |
| DE | 102014112495 A1 | 3/2015 | |
| DE | 102016125428 A1 | 8/2017 | |

* cited by examiner

SEMICONDUCTOR DIE WITH SENSOR SECTION LOCATED AT THE EDGE

CROSS REFERENCE TO RELATED APPLICATION

This application claims priority to German Patent Application No. 102020122871.6, filed on Sep. 1, 2020, the contents of which are incorporated by reference herein in their entirety.

TECHNICAL FIELD

Some implementations described herein relate to a sensor and a semiconductor die for producing a sensor.

BACKGROUND

Modern sensors are increasingly manufactured based on semiconductor dies, which have a microelectronic section and a sensor section. With the aid of established semiconductor processing techniques, many functional units are produced together by processing a semiconductor wafer, wherein the processed semiconductor wafer is then divided into a plurality of semiconductor dies that form the basis for the individual sensors.

BRIEF DESCRIPTION OF THE DRAWINGS

The proposed semiconductor die and the sensor based thereon are now explained in more detail by reference to the drawing. In the drawings.

DETAILED DESCRIPTION

The integration of the sensor section and the microelectronic section in a single semiconductor die facilitates short signal paths, which can minimize interference effects on the measuring signals. In addition, the integration leads to particularly compact sensors and helps to reduce their energy consumption.

There is an increasing need for sensors that exhibit the minimum possible drift of the sensor signal values over a long period of use.

In order to satisfy this requirement, a semiconductor die according to the main claim and a sensor according to the dependent claim is proposed. Advantageous implementations are specified in the dependent claims.

A semiconductor die is proposed, which comprises a microelectronic section and a sensor section. The microelectronic section comprises an integrated circuit. The sensor section adjoins an edge of the semiconductor die.

It has been recognized that the arrangement of the sensor section at the edge of the semiconductor die leads to improved sensor signal values compared to an arrangement of the sensor section in the center of the semiconductor die, in which case the sensor section is surrounded by the microelectronic section.

The structures provided in the sensor section of the semiconductor die are typically manufactured together with semiconductor structures of the microelectronic section during FEOL ("front end of line") processing of the wafer. FEOL processing usually means all the processing steps that are carried out before the first metallization layer which is used for electrically connecting the individual semiconductor components of the microelectronic section.

The metallization and oxide layers added during the BEOL ("back end of line") processing often result in a significant step between the sensor section and the microelectronic section. The presence of steps can also be referred to as topography. It has been found that it is precisely this high step which has an adverse effect on the behavior of the sensor. Since the sensor section adjoins an edge of the semiconductor die, such a step is only present at a small part of the periphery of the sensor section, so that the effect of this step on the sensor accuracy is reduced compared to conventional sensors. Furthermore, the arrangement of the sensor section at the edge of the semiconductor die simplifies the cleaning of the sensor section. In particular, particles cannot collect in the sensor section as easily as is possible with a sensor section that is completely surrounded by an elevated microelectronic section.

In one design it is provided that the sensor section comprises a pressure sensor element, in particular a capacitive pressure sensor element, and/or a magnetic sensor element, in particular a Hall-type sensor element, and/or an acceleration sensor element and/or an ultrasonic transducer element and/or an acoustic transducer element.

The advantageous arrangement of the sensor section on one edge of the semiconductor die can be manifested with all of these elements.

In some implementations, the sensor section has a movable region. In some implementations, a movable region can comprise a mechanically movable region. The movable region can be, in some implementations, a membrane. The movable region can be used, for example, to measure pressures and/or accelerations.

In the microelectronic section of the semiconductor die a die-contacting surface can be provided. The die-contacting surface can be configured to electrically connect the semiconductor die and in particular the integrated circuit to other components. The contacting surface can also be referred to as a pad.

In some designs of the semiconductor die it is provided that the die-contacting surface is arranged on a side of the microelectronic section facing away from the sensor section. In this way, the distance of bonding wires needed for the electrical connection of the semiconductor die from the sensor section can be increased, so that the bonding wires can have less negative effect on the behavior of the sensor.

In some implementations, the sensor section can be free of a metallic interconnection layer. In some implementations, the sensor section can be free of a metallic interconnection layer which is applied during the BEOL processing of the microelectronic section. In some implementations, the sensor section can be essentially free from elevations towards the edge of the semiconductor die, except for the junction with the microelectronic section.

The semiconductor die can have a rectangular shape in plan view, wherein the semiconductor die is divided by a plane into a rectangular microelectronic section in plan view and a rectangular sensor section in plan view. The sensor section can extend over an entire side of the semiconductor die.

Some implementations described herein relate to a sensor with a semiconductor die as described above. The sensor has a housing, wherein the housing has a mounting surface, a contact terminal and a housing contacting surface that is electrically conductively connected to the contact terminal. The sensor has a bonding wire which electrically conductively connects the die-contacting surface to the housing contacting surface. The semiconductor die is mechanically connected to the mounting surface. The mechanical connection can be made, in particular, using an adhesive.

In some implementations, the sensor section of the semiconductor die is free of any wetting by the adhesive.

The lack of a solid mechanical connection from the sensor section to the mounting surface can reduce the stresses generated in the sensor section.

The sensor section of the semiconductor die of the sensor can be covered with a gel. The gel can protect the sensor elements located in the sensor section from harmful environmental conditions, e.g. liquids, gases.

In some implementations, the sensor provides that the die-contacting surface and/or the bonding wire and/or the housing contacting surface are embedded in an encapsulation. This allows the die-contacting surface, the bonding wire and the housing contacting surface to be protected from harmful environmental effects. In some implementations, the encapsulation can reduce the risk of the bonding wire becoming detached from the die-contacting surface and/or the housing contacting surface due to mechanical effects.

The encapsulation can be produced, in some implementations, by film assisted molding (FAM). The proposed arrangement of the sensor section adjacent to an edge of the semiconductor die can only support encapsulation by film assisted molding. The film assisted molding as a packaging process can enable sensors that are characterized by reduced dimensions compared to conventional sensors.

On the side of the semiconductor die facing away from the mounting surface, a stopper can be provided to prevent wetting of the sensor section with an encapsulation material. In some implementations, the stopper can be provided to separate the encapsulation and the gel. This can prevent the material for the encapsulation reaching the sensor section, where it can have an adverse effect on the sensor elements.

In some implementations, a barrier is provided on the side of the semiconductor die facing the mounting surface to prevent wetting of the sensor section by the adhesive.

Figure 1:
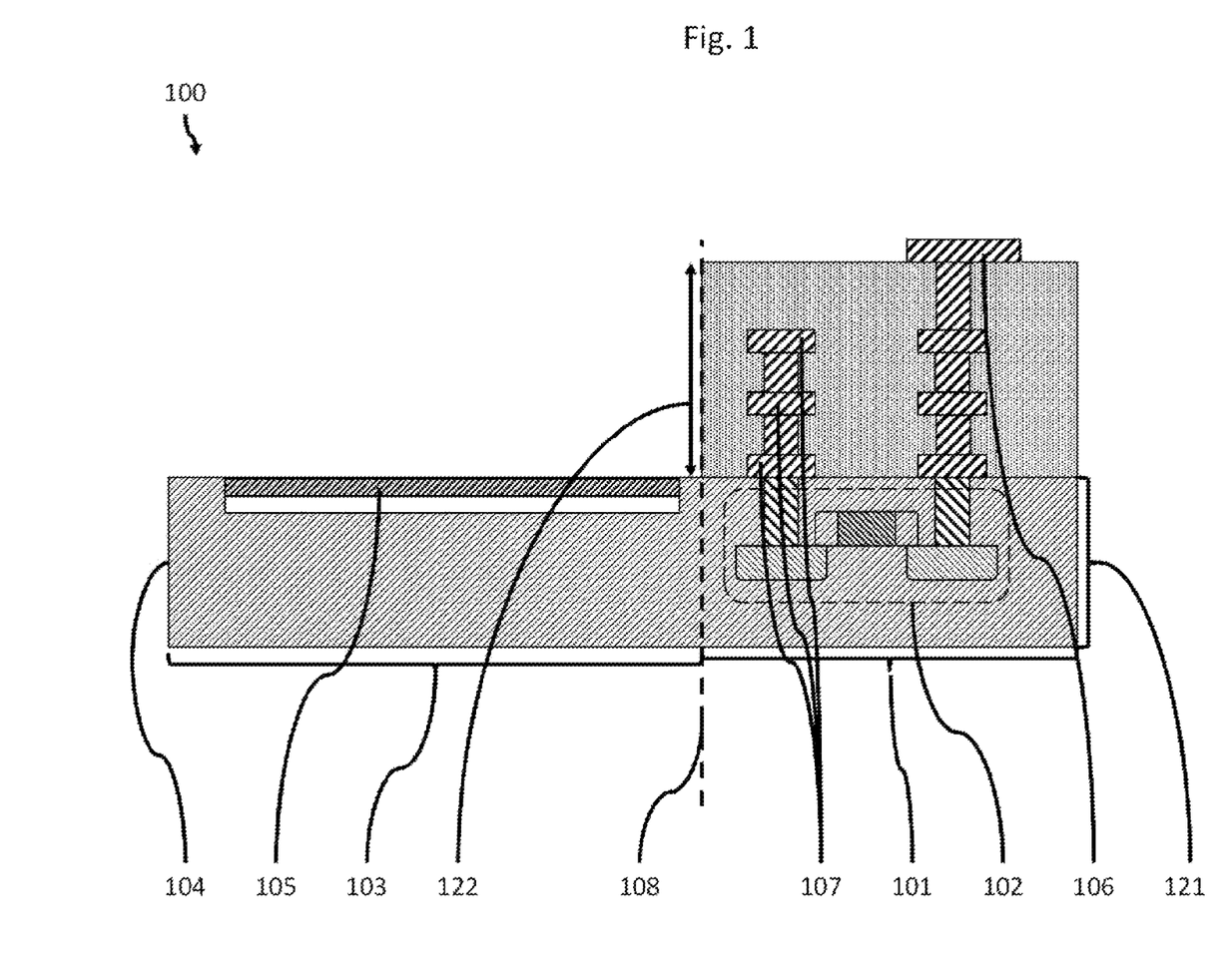
FIG. 1 shows semiconductor die in a cross-sectional view.

The semiconductor die 100 shown in FIG. 1 comprises a microelectronic section 101 and a sensor section 103. The microelectronic section 101 and the sensor section are separated from each other by a plane 108. In the microelectronic section 101 a plurality of semiconductor devices are provided, as indicated by the transistor 102. In the microelectronic section, amplifier circuits, analog-to-digital converters, logic modules, ASICs, and/or FPGAs may be provided, with which sensor signals generated by sensor elements provided in the sensor section can be evaluated. The sensor section 103 adjoins an edge 104 of the semiconductor die 100. A sensor element which is provided in the sensor section 103 has a membrane 105. The sensor element is located in the layers 121 which were produced during the FEOL processing. In some implementations, the sensor element is located in the layers manufactured together with the semiconductor component 102. Above the semiconductor device 102, a plurality of metallization layers 107 is provided, with which the semiconductor device 102 is electrically interconnected with other semiconductor devices. In addition, the metallization layers 107, also known as interconnection layers, are connected to a semiconductor-die contacting surface 106.

The metallization layers 107 and the semiconductor-die contacting surface 106 were produced as part of the BEOL processing. The additional layers produced during the BEOL processing give rise to a step 122 between the sensor section 103 and the microelectronic section 101. Since the sensor section 103 adjoins the edge 104 of the semiconductor die 100, this step 122 is only present on one side of the sensor section 103, so that it has a smaller effect on the behavior of the sensor elements compared to conventional arrangements of the sensor section. In addition, foreign particles can collect less easily in the sensor section 103.

Figure 2:
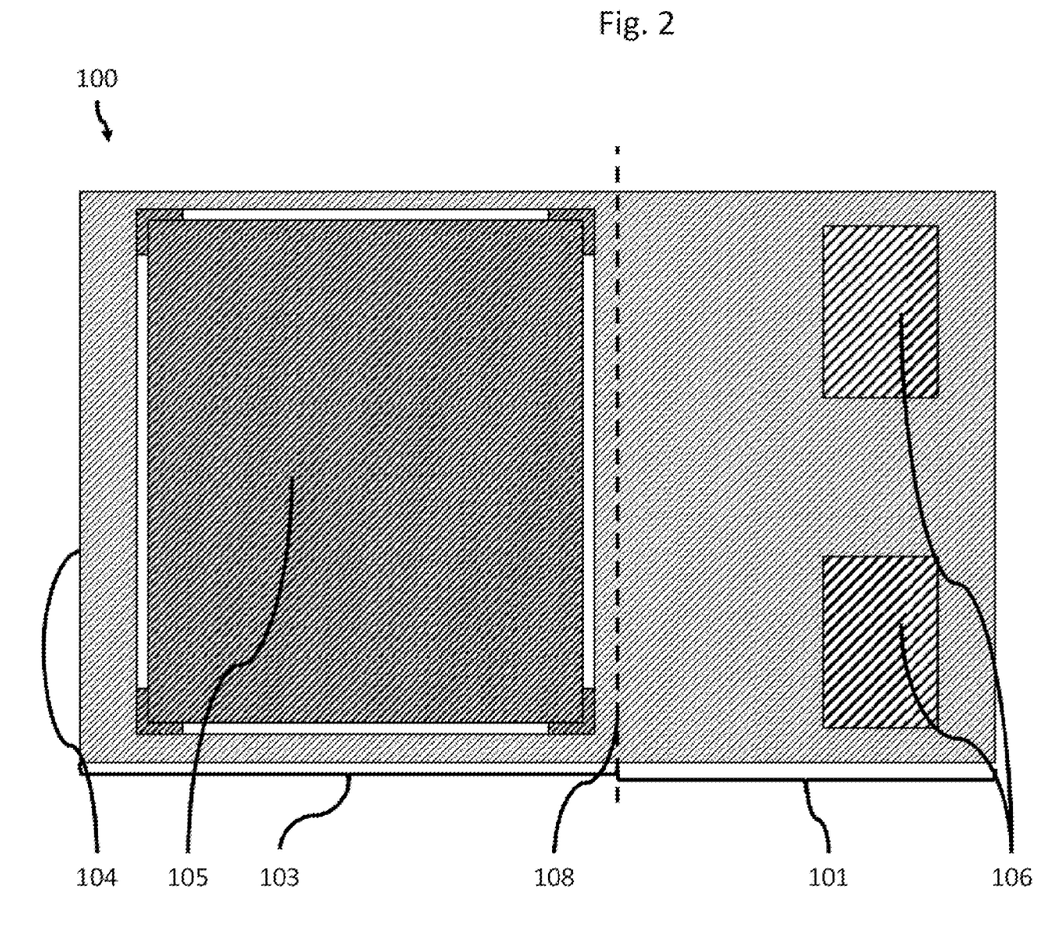
FIG. 2 shows the semiconductor die according to FIG. 1 in a plan view.

FIG. 2 shows the semiconductor die 100 shown in FIG. 1 in a plan view. The semiconductor die 100 has an essentially rectangular shape in plan view. The plane 108 divides the semiconductor die 100 into a sensor section 103 and a microelectronic section 101. The plane is arranged in such a way that the sensor section 103 and the microelectronic section 101 in plan view also have a rectangular shape.

Figure 3:
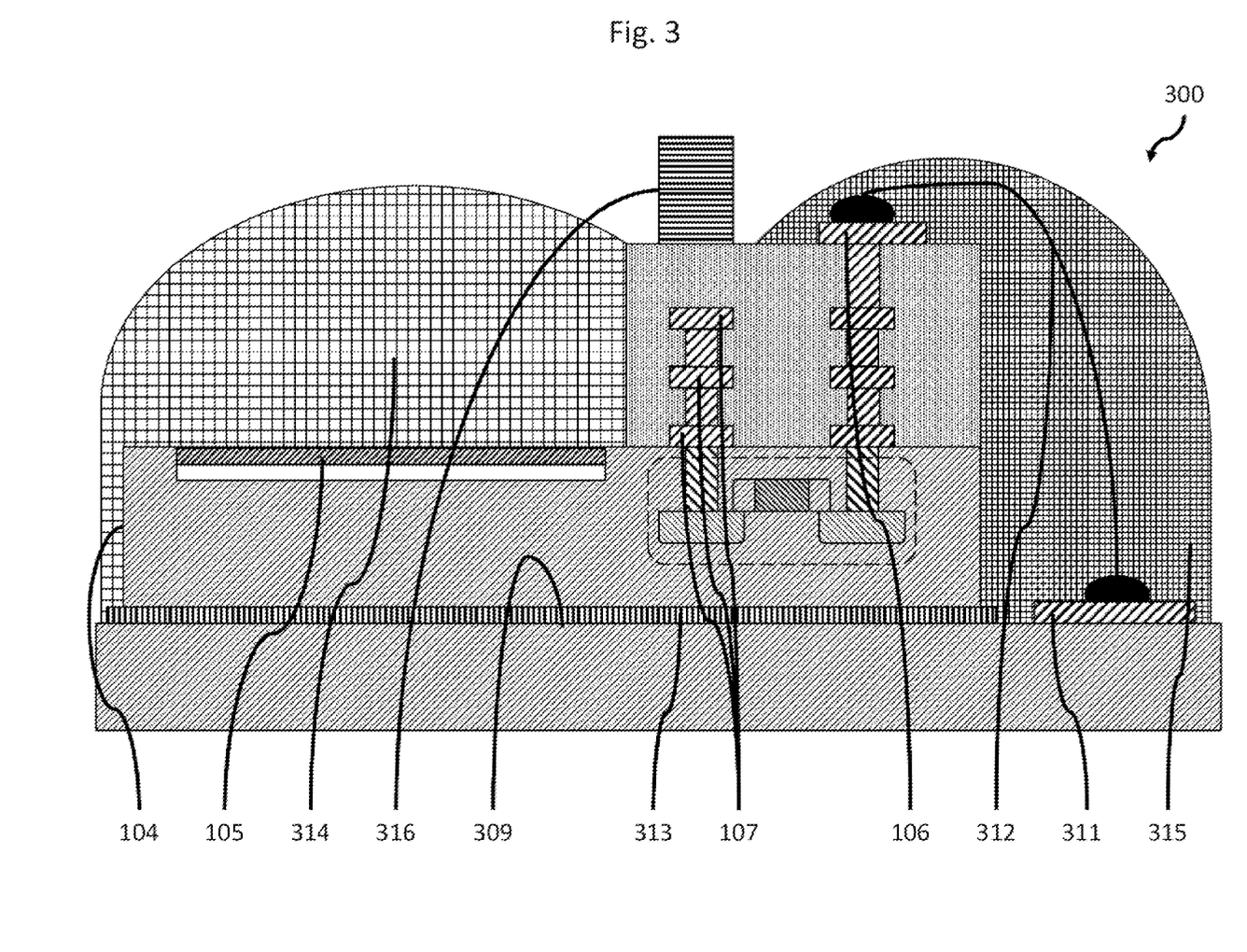
FIG. 3 shows a sensor in cross-section.

FIG. 3 shows a sensor 300. The sensor 300 comprises a housing with a mounting surface 309 on which a semiconductor die is mounted using adhesive 313. The housing has a housing contacting surface 311. The semiconductor-die contacting surface 106 is electrically connected to the housing contacting surface 311 using a bonding wire 312.

The semiconductor-die contacting surface 106, the bonding wire 312 and the housing contacting surface 311 are arranged in an encapsulation 315.

The semiconductor die can optionally comprise a stopper 316, with which the material of the encapsulation 315 can be prevented from wetting the sensor section in which the membrane 105 is located. For the protection of the sensor elements in the sensor section a gel 314 is provided, which also covers the membrane 105.

Figure 4:
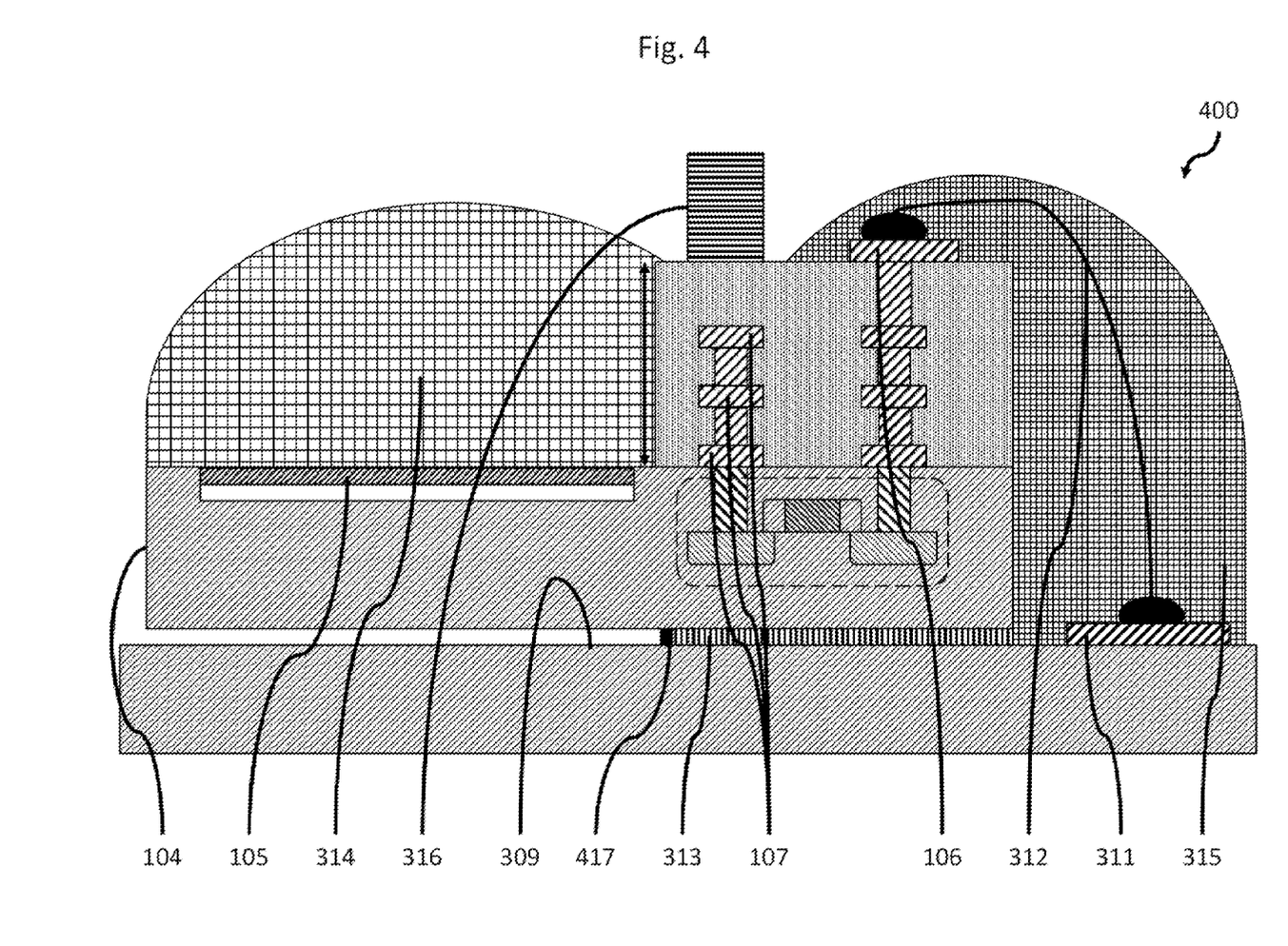
FIG. 4 shows a sensor in cross-section.

FIG. 4 shows a sensor 400 similar to the sensor 300. In some implementations, the sensor 300, in the sensor 400 no adhesive 313 is provided underneath the sensor section. Instead, a barrier 417 prevents a mechanical connection being produced between the sensor section and the mounting surface 309 when the semiconductor die is mounted on the mounting surface 309. This can reduce the risk of mechanical stresses being transmitted from the housing to the sensor section.

Figure 5:
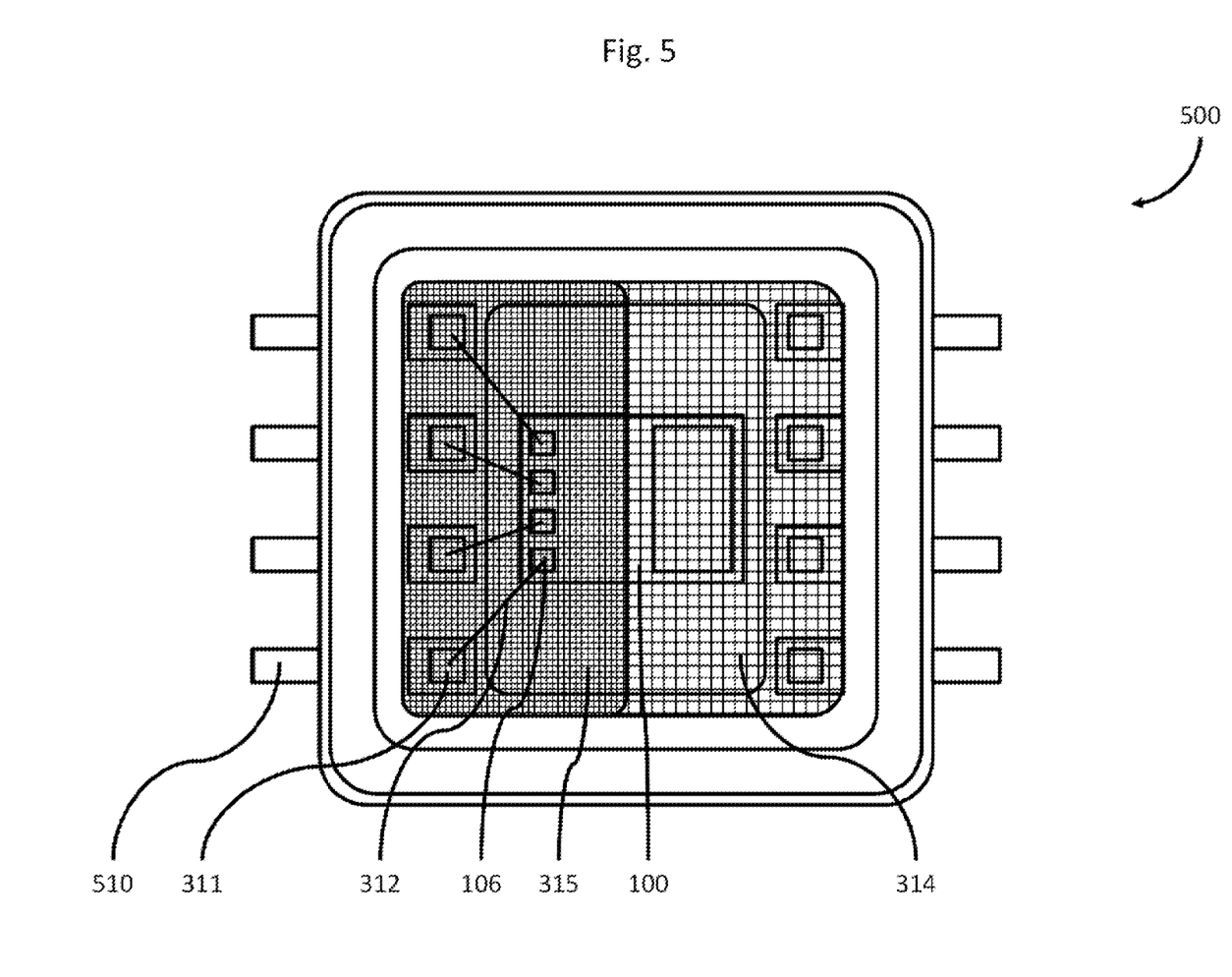
FIG. 5 shows a sensor in plan view.

FIG. 5 shows a further sensor 500 in plan view. The housing of the sensor 500 comprises contact terminals 510 which are connected to housing contacting surfaces 311. Bonding wires 312 produce an electrical connection between the housing contacting surfaces 311 and the semiconductor-die contacting surfaces 106. The housing contact surfaces 311, the bonding wires 312 and the semiconductor-die contacting surfaces 106 are arranged in an encapsulation 315. For example, the encapsulation 315 can be produced using an epoxy resin. The sensor section of the semiconductor die 100 is covered with a gel 314 to protect the sensor elements of the sensor section from environmental effects.

Figure 6:
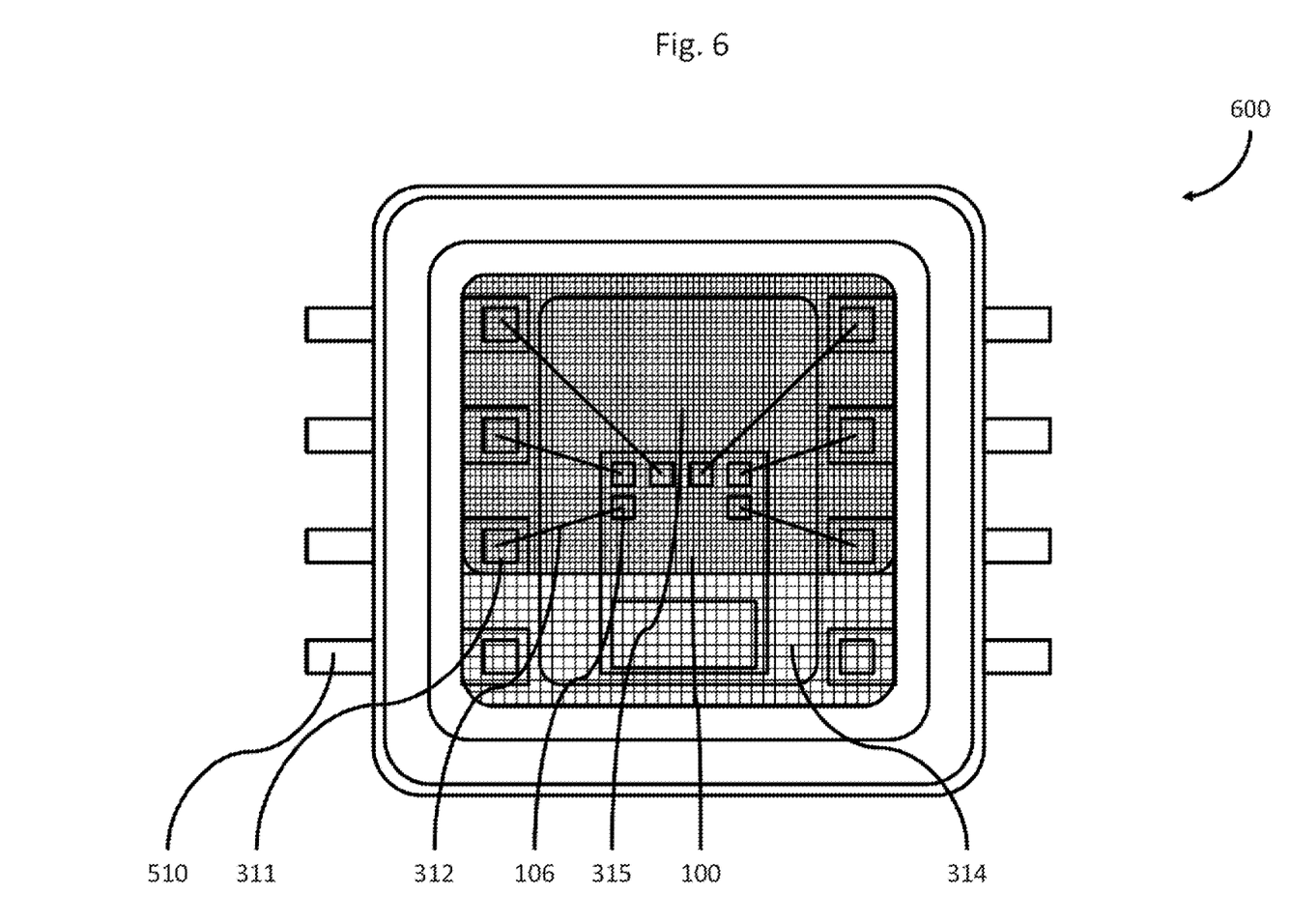
FIG. 6 shows a sensor in plan view.

FIG. 6 shows a sensor 600 similar to the sensor 500 in a plan view. The sensor 600 differs from the sensor 500 shown in FIG. 5 by the orientation of the semiconductor die 100 in the housing. The selected orientation of the semiconductor die 100 allows 6 housing contacting surfaces 311 to be connected to 6 semiconductor-die contacting surfaces using 6 bonding wires 312.

Figure 7:
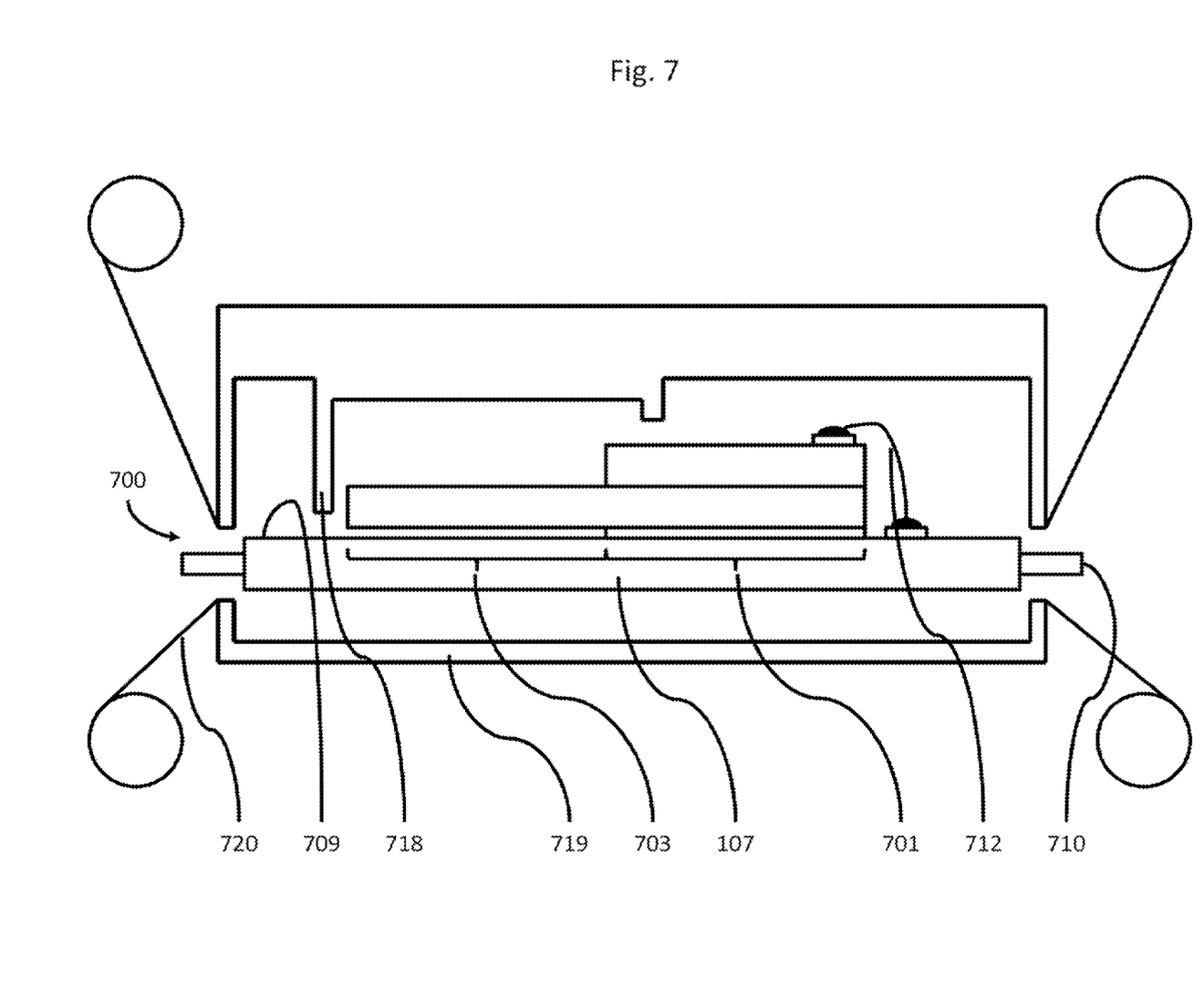
FIG. 7 shows a method step for producing a sensor.
Figure 9:
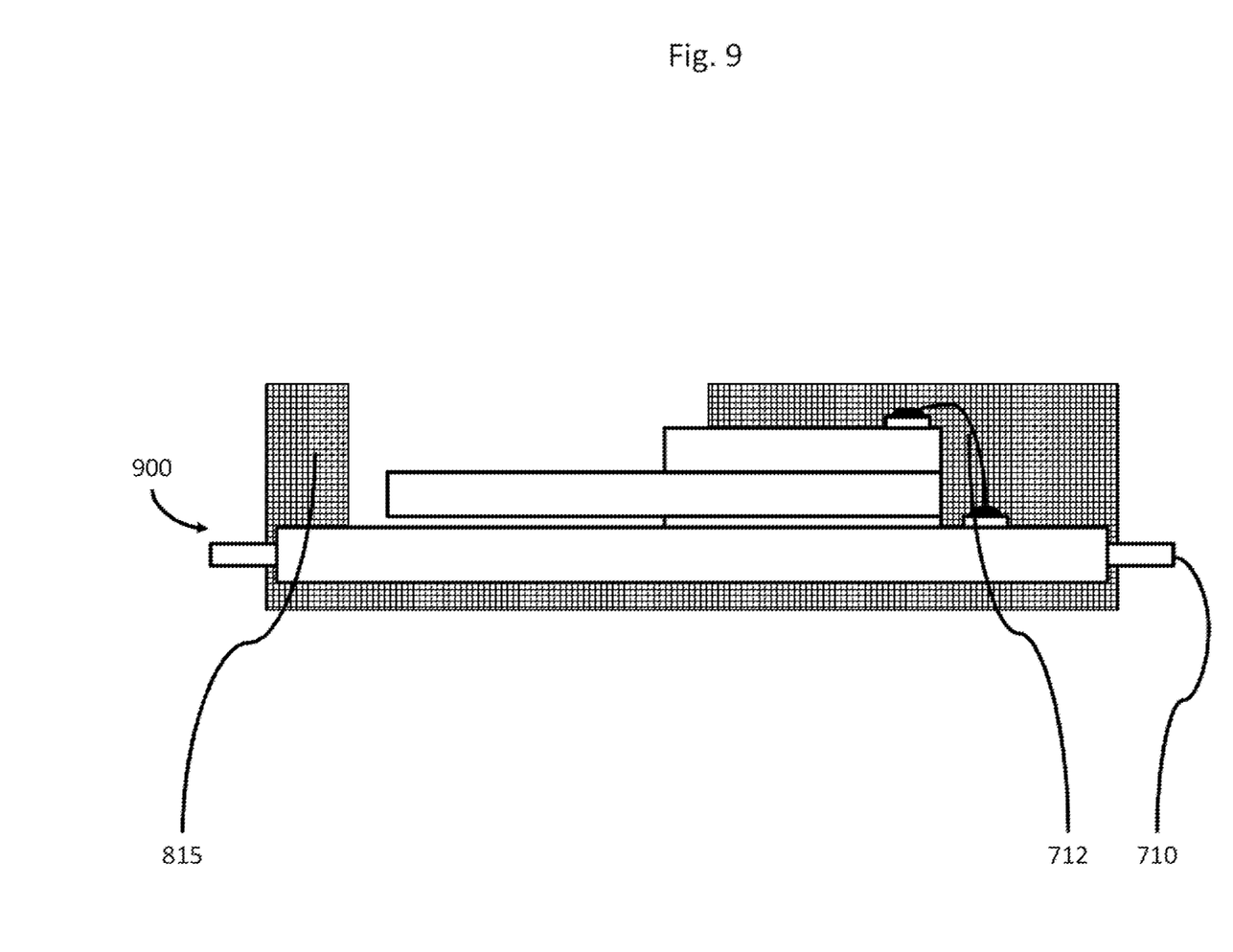
FIG. 9 shows a sensor according to the method step shown in FIG. 8.

FIG. 7 illustrates a method step for manufacturing a sensor 900 (see FIG. 9). A semiconductor die with a sensor section 703 and a microelectronic section 701 is mechanically connected to the mounting surface 709 of a housing, such as, for example, a lead frame. The electrical connection between a semiconductor-die contacting surface and a housing contacting surface is produced with a bonding wire 712. The housing contacting surface is electrically connected to a contact terminal 710.

Shown are an upper mold half 718 and a lower mold half 719, between which the housing 700 with the semiconductor-die is arranged. A foil 720 is provided between the housing 700 and each of the mold halves 718 and 719.

Figure 8:
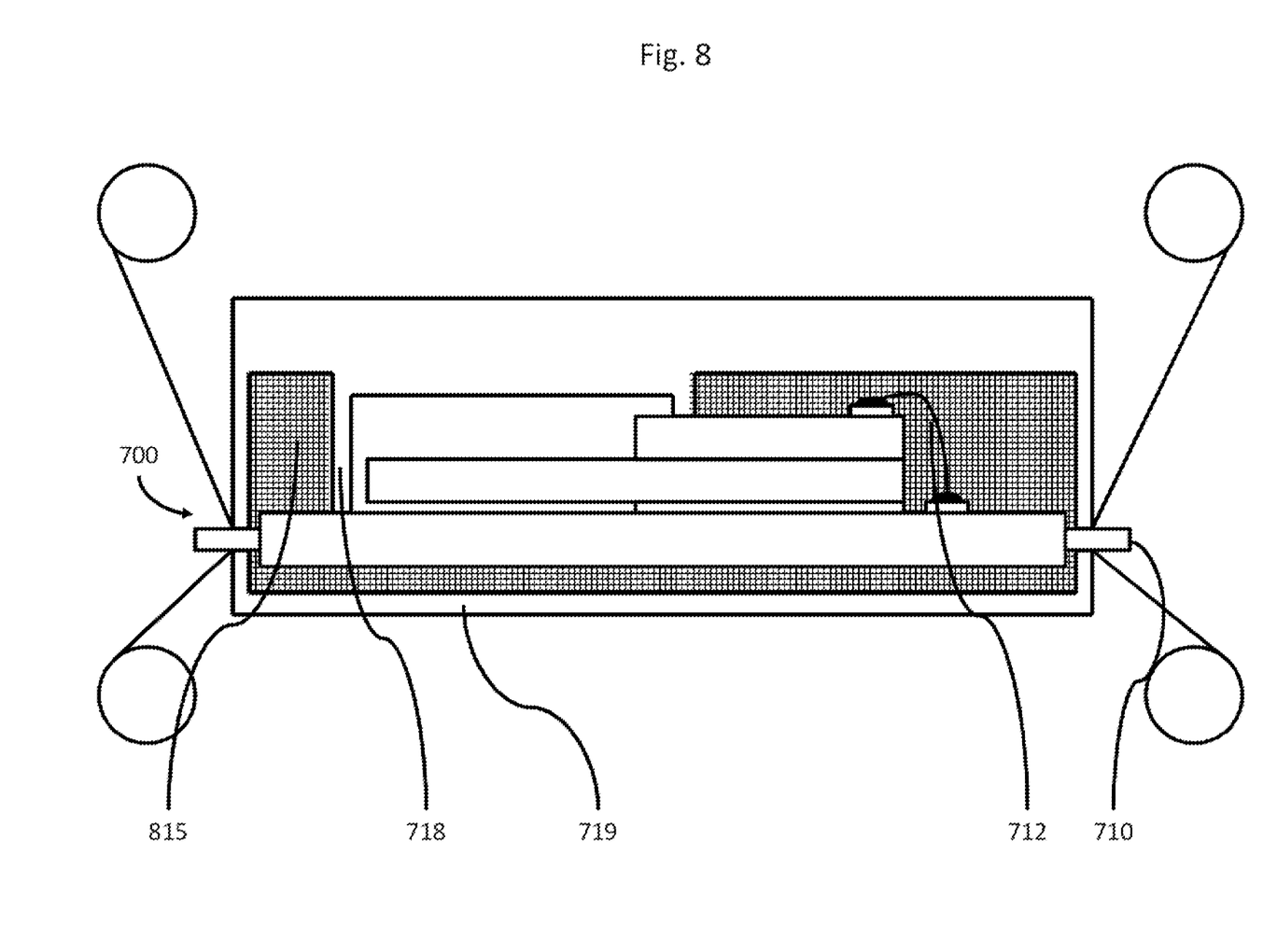
FIG. 8 shows a further method step for manufacturing the sensor.

After the two mold halves 718 and 719 have been brought together, as shown in FIG. 8, the foil 720 seals the contact points between the mold halves 718 and 719 as well as the housing 700 or the semiconductor die. After the molds 718 and 719 are closed, a material for producing the encapsulation 815 is introduced. Due to the shape of the molds 718 and 719 and the sealing by the film 720, the sensor section of the semiconductor die remains free of any wetting by the material of the encapsulation 815. The bonding wire 712 and the housing contacting surfaces and semiconductor-die contacting surfaces contacted by the bonding wire are surrounded by the material of the encapsulation 815.

FIG. 9 shows the sensor 900 after removal from the mold. The sensor section of the semiconductor die is not surrounded by the material of the encapsulation 815.

Figure 10:
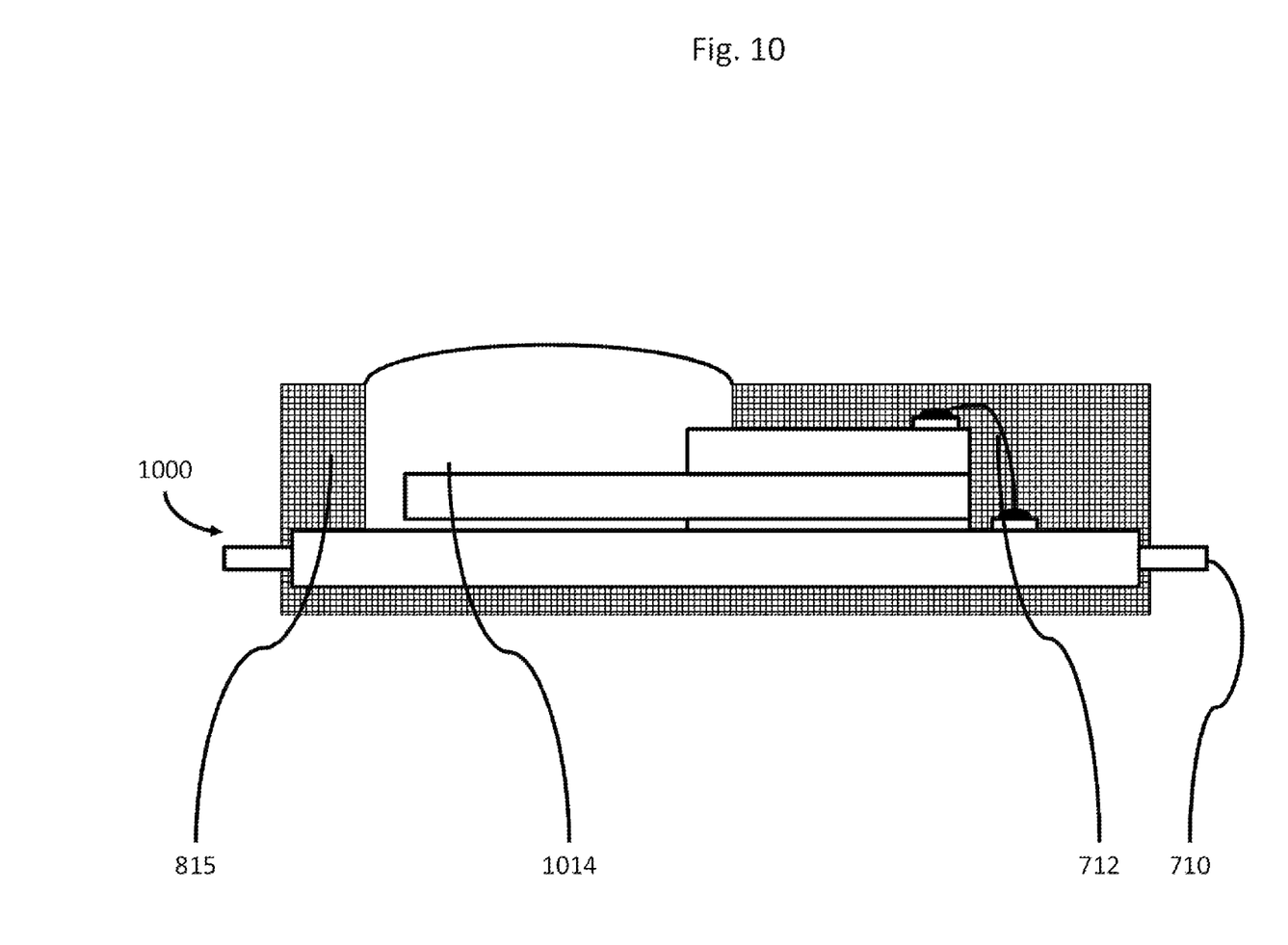
FIG. 10 shows the sensor according to a further method step.

FIG. 10 shows that the sensor section can finally be covered with a gel 1014 to prevent contamination of the sensor section with foreign particles or other harmful environmental effects.

ASPECTS

Some example implementations are defined by the following aspects:

Aspect 1. Semiconductor die, wherein the semiconductor die has a microelectronic section, wherein the microelectronic section comprises an integrated circuit, wherein the semiconductor die comprises a sensor section, wherein the sensor section adjoins an edge of the semiconductor die.

Aspect 2. Semiconductor die according to aspect 1, wherein the sensor section comprises a pressure sensor element, in particular a capacitive pressure sensor element, and/or a magnetic sensor element, in particular a Hall-type sensor element, and/or an acceleration sensor element and/or an ultrasonic transducer element and/or an acoustic transducer element.

Aspect 3. Semiconductor die according to aspect 1 or 2, wherein the sensor section comprises a movable region.

Aspect 4. Semiconductor die according to one of the preceding aspects, wherein the semiconductor die comprises a die-contacting surface in the microelectronic section.

Aspect 5. Semiconductor die according to aspect 4, wherein the die-contacting surface is arranged on a side of the microelectronic section facing away from the sensor section.

Aspect 6. Semiconductor die according to one of the preceding aspects, wherein the sensor section is free of a metallic interconnection layer.

Aspect 7. Semiconductor die according to one of the preceding aspects, wherein the semiconductor die has a rectangular shape in plan view, wherein the semiconductor die is divided by a plane into a rectangular microelectronic section in plan view and a rectangular sensor section in plan view.

Aspect 8. Sensor having a semiconductor die according to one of the preceding aspects, having a housing, wherein the housing comprises a mounting surface, a contact terminal and a housing contacting surface electrically conductively connected to the contact terminal, and having a bonding wire, wherein the die-contacting surface is electrically conductively connected to the housing contacting surface using the bonding wire, wherein the semiconductor die is mechanically connected to the mounting surface, in particular using an adhesive.

Aspect 9. Sensor according to aspect 8, wherein the sensor section of the semiconductor die is free of any wetting by the adhesive.

Aspect 10. Sensor according to aspect 8 or 9, wherein the sensor section of the semiconductor die is covered with a gel.

Aspect 11. Sensor according to any one of aspects 8 through 10, wherein the die-contacting surface and/or the bonding wire and/or the housing contacting surface are embedded in an encapsulation.

Aspect 12. Sensor according to aspect 11, wherein the encapsulation is produced by film assisted molding.

Aspect 13. Sensor according to any one of aspects 8 through 12, wherein on the side of the semiconductor die facing away from the mounting surface, a stopper is provided to prevent wetting of the sensor section by a material of the encapsulation, in particular to separate the encapsulation and the gel.

Aspect 14. Sensor according to any one of aspects 8 through 13, wherein on the side of the semiconductor die facing the mounting surface, a barrier is provided to prevent wetting of the sensor section by the adhesive.

Although specific example implementations have been illustrated and described in this description, persons with current knowledge of the art will recognize that a plurality of alternative and/or equivalent implementations can be chosen as a substitute for the specific example implementations shown and described in this description, without deviating from the scope of the implementation disclosed. It is the intention that this application covers all adaptations or variations of the specific example implementations discussed here. It is therefore intended that this disclosure is limited only by the claims and their equivalents.

What is claimed is:

1. A semiconductor die comprising:
   a microelectronic section,
      wherein the microelectronic section comprises an integrated circuit; and
   a sensor section,
      wherein a first side of the sensor section adjoins an edge of the semiconductor die,
      wherein a step formed by a plurality of metallization layers of the microelectronic section is present only on a second side of the sensor section that is opposite of the first side of the sensor section,
      wherein the sensor section is configured to be positioned above a mounting surface of a housing,
      wherein the sensor section is free of any wetting by an adhesive that mechanically connects the semiconductor die to the mounting surface of the housing, and
      wherein a barrier prevents a mechanical connection from being produced between the sensor section and the mounting surface of the housing when the semiconductor die is mounted on the mounting surface of the housing.

2. The semiconductor die as claimed in claim 1, wherein the sensor section comprises one or more of:
a magnetic sensor element,
an acceleration sensor element,
an ultrasonic transducer element, or
an acoustic transducer element.

3. The semiconductor die as claimed in claim 1, wherein the sensor section comprises a movable region.

4. The semiconductor die as claimed in claim 1, further comprising:
a die-contacting surface associated with the microelectronic section.

5. The semiconductor die as claimed in claim 4, wherein the die-contacting surface is located on a side of the microelectronic section facing away from the sensor section.

6. The semiconductor die as claimed in claim 1, wherein the sensor section is free of a metallic interconnection layer.

7. The semiconductor die as claimed in claim 1, wherein the semiconductor die has a rectangular shape in a plan view, and
wherein the semiconductor die is divided by a plane into a rectangular microelectronic section in the plan view and a rectangular sensor section in the plan view.

8. The semiconductor die as claimed in claim 2, wherein the semiconductor die includes a pressure sensor element, and wherein the pressure sensor element comprises a capacitive pressure sensor element.

9. The semiconductor die as claimed in claim 2, wherein the semiconductor die includes the magnetic sensor element, and wherein the magnetic sensor element comprises a Hall-type sensor element.

10. A sensor comprising:
a semiconductor die comprising:
a microelectronic section that comprises an integrated circuit; and
a sensor section, wherein a first side of the sensor section adjoins an edge of the semiconductor die, and wherein a step formed by a plurality of metallization layers of the microelectronic section is present only on a second side of the sensor section that is opposite of the first side of the sensor section;
a housing, wherein the housing comprises:
a mounting surface,
a contact terminal, and
a housing contacting surface electrically conductively connected to the contact terminal; and
a bonding wire,
wherein bonding wire electrically conductively connects a die-contacting surface to the housing contacting surface,
wherein the die-contacting surface is located on a side of the microelectronic section facing away from the sensor section,
wherein the sensor section is configured to be positioned above the mounting surface,
wherein the sensor section is free of any wetting by an adhesive that mechanically connects the semiconductor die to the mounting surface, and
wherein a barrier prevents a mechanical connection from being produced between the sensor section and the mounting surface when the semiconductor die is mounted on the mounting surface.

11. The sensor as claimed in claim 10, wherein the sensor section of the semiconductor die is covered with a gel.

12. The sensor as claimed in claim 10, wherein one or more of the die-contacting surface, the bonding wire, or the housing contacting surface are embedded in an encapsulation.

13. The sensor as claimed in claim 12, wherein the encapsulation is manufactured by film assisted molding.

14. The sensor as claimed in claim 12, wherein the sensor section of the semiconductor die is covered with a gel, and
wherein a stopper is included on the side of the semiconductor die facing away from the mounting surface, wherein the stopper prevents wetting of the sensor section by a material of the encapsulation.

15. The sensor as claimed in claim 10, wherein the barrier is included on the side of the semiconductor die facing the mounting surface, wherein the barrier prevents wetting of the sensor section by the adhesive that mechanically connects the semiconductor die to the mounting surface.

16. The sensor as claimed in claim 14, wherein the stopper separates the encapsulation and the gel.

17. The sensor as claimed in claim 10, wherein the sensor section is free of a metallic connection layer.

18. The sensor as claimed in claim 10, wherein the semiconductor die has a rectangular shape in a plan view, and
wherein the semiconductor die is divided by a plane into a rectangular microelectronic section in the plan view and a rectangular sensor section in the plan view.

19. The sensor as claimed in claim 10, wherein the sensor section comprises a movable region.

20. The sensor as claimed in claim 10, wherein the sensor section comprises one or more of:
a magnetic sensor element,
an acceleration sensor element,
an ultrasonic transducer element, or
an acoustic transducer element.

* * * * *